United States Patent
Hinterscher et al.

(10) Patent No.: US 6,300,815 B1
(45) Date of Patent: Oct. 9, 2001

(54) VOLTAGE REFERENCE OVERSHOOT PROTECTION CIRCUIT

(75) Inventors: Eugene B. Hinterscher, McKinney; Timothy A. Ten Eyck, Anna, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/494,622

(22) Filed: Jan. 31, 2000

(51) Int. Cl.[7] ....................... H03K 5/08
(52) U.S. Cl. .................. 327/309; 327/312; 327/313; 361/90
(58) Field of Search ................... 327/309, 310, 327/311, 313, 314, 315, 318, 320, 321, 324, 325, 327, 328; 361/90, 91

(56) References Cited

U.S. PATENT DOCUMENTS

| | | | | |
|---|---|---|---|---|
| 3,867,649 | * | 2/1975 | Cochran | 327/306 |
| 5,066,875 | * | 11/1991 | Ueno et al. | 326/63 |
| 5,534,811 | * | 7/1996 | Gist et al. | 327/309 |
| 5,793,241 | * | 8/1998 | Sanzo et al. | 327/323 |
| 6,018,202 | * | 1/2000 | Meinders | 307/10.6 |

* cited by examiner

*Primary Examiner*—Terry D. Cunningham
*Assistant Examiner*—An T. Luu
(74) *Attorney, Agent, or Firm*—Dwight N. Holmbo; Wade James Brady, III; Frederick J. Telecky, Jr.

(57) ABSTRACT

A voltage reference overshoot protection circuit senses unwanted ringing voltage levels in a driven device such as a backplane and controls the gate voltage to a voltage level control transistor such that a ringing output signal produced by an associated output driver is reduced in response to a control signal dependent on the ringing voltage level.

14 Claims, 2 Drawing Sheets

VOLTAGE REFERENCE OVERSHOOT PROTECTION CIRCUIT

BACKGROUND OF THE INVENTION

1. Field of the Invention

This invention relates generally to dampening circuits, and more particularly to a voltage reference overshoot protection circuit to dampen residual device, e.g. backplane, energy during switching operations.

2. Description of the Prior Art

Dampening circuits are well known in the art. The type of dampening circuit used is dependent upon the particular application. One application of dampening circuits is associated with unwanted ringing in a backplane. Recent advancements in backplane technology have made higher switching speeds possible. Modern trends indicate that improvements in switching speeds associated with backplanes will not only be desirable, but necessary, in order to accommodate the higher CPU speeds utilized in state of the art computers and related peripherals, among other devices.

One source of ringing in backplanes is associated with a low to high switching transition of a backplane driver voltage. Those skilled in the art of backplane technology have generally used edge rate control techniques to minimize the ringing in a backplane during a backplane driver output signal low to high switching transition. Edge rate control techniques are used to increase the rise and fall times of the backplane driver output signal. Although these known techniques have proven adequate in the past, such techniques are not able to accommodate the high speeds necessary to provide backplanes that are functional with higher speed computers, peripherals and other digital devices presently being designed and produced. These known edge rate control dampening techniques are problematic in that they reduce the bandwidth necessary to accommodate the higher data transmission rates and shorter propagation delay times generally associated with modern communication devices and protocols.

In view of the foregoing, a need exists for a dampening circuit capable of eliminating or substantially reducing unwanted ringing in devices such as backplanes, among other like devices. The bandwidth capabilities of such devices can then be optimized to accommodate higher data transmission speeds than that achievable using conventional edge rate control techniques generally known in the art.

SUMMARY OF THE INVENTION

The present invention is directed to a dampening circuit architecture capable of substantially reducing the ringing voltage injected into a driven device, e.g. backplane, associated with a driver circuit such as a backplane driver. One preferred embodiment of the present invention is a voltage reference overshoot protection circuit that reduces the unwanted ringing in a backplane. This is achieved without the aid of an internally controlled bias generator.

A simple open drain output driver is used to help summarize the present invention. In one embodiment, an open drain output driver is coupled to a supply voltage $V_{TT}$ via a pull-up resistor connected to a backplane. Thus, when the open drain output driver is turned off, it will be pulled to a "high" state via the supply voltage $V_{TT}$. If this low to high transition has a fast edge rate, unwanted ringing can occur in the backplane.

The present invention substantially reduces the unwanted ringing in the backplane as follows. One preferred embodiment of the present invention comprises a p-channel transistor having a gate voltage $V_{REF}$, provided by an external voltage source. When the voltage provided by the open drain output driver rises above the gate voltage $V_{REF}$, plus the voltage threshold of the p-channel transistor, the p-channel transistor will start to turn "on" and supply a gate voltage to an n-channel dampening transistor. As the ringing gets higher, more gate voltage is supplied to the n-channel dampening transistor, thereby pulling the open drain output driver voltage down and counteracting the undesirable ringing in the backplane caused by the open drain output driver overshoot.

In view of the foregoing descriptions, another preferred embodiment of the present voltage reference overshoot dampening circuit comprises:

a first transistor capable of receiving a reference voltage signal and configured to receive an oscillating voltage signal such that the first transistor can pass a current proportional to the oscillating voltage signal there through when the oscillating voltage signal exceeds a level determined by the reference voltage signal and a turn-on voltage signal associated with the first transistor; and a second transistor configured to receive the oscillating voltage signal and the current passed by the first transistor such that the second transistor is capable of reducing the oscillating voltage signal in proportion to a current received from the first transistor.

Another preferred embodiment of the present voltage reference overshoot dampening circuit comprises:

a first transistor configured to receive a reference voltage and further configured to receive a ringing voltage such that the first transistor can generate a control voltage when the ringing voltage exceeds a level determined by the reference voltage and a turn-on voltage associated with the first transistor; and a second transistor configured to receive the control voltage generated by the first transistor such that the second transistor is capable of reducing the ringing voltage received by the first transistor.

Yet another preferred embodiment of the present voltage reference overshoot dampening circuit comprises:

a p-channel transistor having a drain, a gate configured to receive a reference voltage and a source configured to receive a ringing voltage such that the first transistor can generate a variable drain voltage when the ringing voltage exceeds a level determined by the reference voltage and the p-channel transistor turn-on voltage; and a first n-channel transistor having a gate configured to receive the variable drain voltage generated by the p-channel transistor and further having a source configured to receive the ringing voltage such that the first n-channel transistor is capable of changing the ringing voltage received by the p-channel transistor in response to a change in the variable drain voltage generated by the p-channel transistor.

Still another preferred embodiment of the present invention comprises:

means for receiving a ringing voltage and generating a variable control voltage when the ringing voltage exceeds a predetermined level such that the variable control voltage amplitude at a particular moment in time is dependent on the ringing voltage amplitude at the particular moment in time; and means for receiving the variable control voltage and changing the ringing voltage amplitude at the particular moment in time in response thereto.

Yet another preferred embodiment of the present invention comprises:

a first transistor configured to receive a reference voltage and a ringing voltage such that the first transistor can generate a control current having a value dependent upon the ringing voltage amplitude when the ringing voltage amplitude exceeds a level determined by the reference voltage and a turn-on voltage associated with the first transistor; and a second transistor configured to receive the ringing voltage and the control current generated by the first transistor such that the second transistor is capable of changing the ringing voltage amplitude in response to the control current received from the first transistor.

Thus, in one aspect of the invention, an overshoot protection circuit substantially reduces unwanted ringing in a device such as a backplane without the aid of an internally controlled bias generator.

In still another aspect of the invention, an overshoot protection circuit substantially reduces unwanted ringing in a device without impairment of "off" state current specifications.

BRIEF DESCRIPTION OF THE DRAWING

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
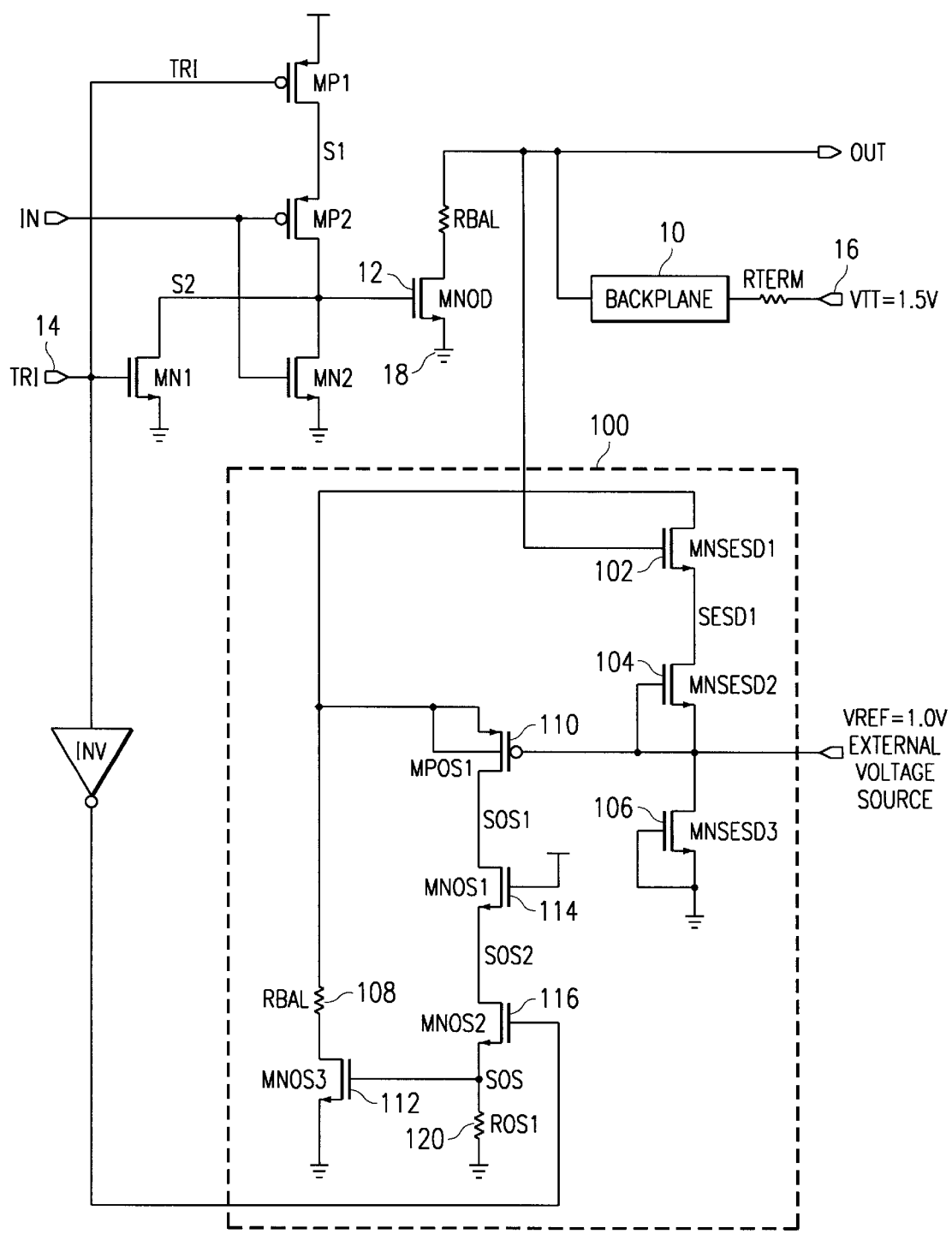
FIG. 1 illustrates an overshoot protection circuit according to one preferred embodiment of the present invention.

FIG. 1B illustrates an overshoot protection circuit 100 according to one preferred embodiment of the present invention. The overshoot protection circuit 100 helps dampen the energy left in a backplane 10 or other like device during a low to high output transition from a driver device such as the open drain output backplane driver transistor 12 depicted in FIG. 1A. The present invention, although described in terms of a backplane driver 12, is in no way to be interpreted as being limited in application to backplane driver devices. A simple open drain output backplane driver 12 and associated backplane 10 are used herein solely for purposes of explaining the present invention and to preserve clarity and brevity. Further, the backplane 10 itself is external to the present invention.

Looking again at FIG. 1B, the voltage reference overshoot protection circuit 100 accepts an external reference voltage $V_{REF}$. The external reference voltage $V_{REF}$, has a value dependent upon the particular application. In the instant case, the external reference voltage $V_{REF}$, is 1-volt dc. The GTLP line of products, for example, available from Texas Instruments Incorporated of Dallas, Tex., use an external reference voltage $V_{REF}$, of 1-volt dc and would find useful applications when combined with the present invention. Transistors 102, 104 and 106 as well as ballast resistor 108 are simply electrostatic discharge (ESD) protection devices added to provide increased reliability and are not necessary, although most preferable, to practice the present invention.

The simple open drain output driver transistor 12 shown in FIG. 1A is now used to help explain the structure and operation of the voltage reference overshoot protection circuit 100 illustrated in FIG. 1B. When the open drain output driver transistor 12 is turned "off" via an input signal at input node 14, a supply voltage $V_{TT}$ at node 16, (approximately 1.5-volts dc in the instant case), will pull the backplane 10 to a "high" state (approximately 1.5-volts dc). This will occur since the open drain output drive transistor 12 will act as an open circuit between the backplane 10 and the IC ground node 18. If this "low" to "high" transition has a fast edge rate, ringing can occur in the backplane 10 during this transition. The voltage reference overshoot protection circuit 100 will operate to dampen the unwanted energy left in the backplane 10 during this transition as described herein below. If the ringing at the output of the open drain output driver transistor 12 goes above the reference voltage $V_{REF}$, (1-volt dc), plus the voltage threshold of p-channel transistor 110, then p-channel transistor 110 will start to turn "on" and supply a gate voltage to n-channel transistor 112.

The n-channel transistors 114 and 116 are biased "on" during this transition and appear as short circuits between the p-channel transistor 110 and the gate of n-channel transistor 112. Although not necessary to practice the present invention, a further explanation setting forth the purpose and operation of n-channel transistors 114, 116 will be provided herein following further details of operation for the present voltage reference overshoot protection circuit 100.

As the above described ringing in the backplane 10 gets even higher, more voltage is supplied to the gate of n-channel transistor 112 since the p-channel transistor 110 is then turned "on" even harder allowing more current to pass through current limiting resistor 120 which raises the voltage on the n-channel transistor 112 gate. As the n-channel transistor 112 is turned "on", it will then pull the output of the open drain output driver transistor 12 downward, thereby counteracting the undesirable overshoot caused by the fast edge rate signal presented to the backplane 10 during the turn-on of open drain output driver transistor 12. Thus, the stronger the ringing, the harder n-channel transistor 112 is turned "on" to help counteract the overshoot. In other words, n-channel transistor 112 provides a path for the unwanted energy left in the backplane 10 to subside during the low to high transition at the output of the output driver transistor 12.

Although not necessary to the present invention, n-channel transistor 114 is provided to set the voltage reference overshoot protection circuit 100 in an "off" condition during periods of inactivity. Transistor 114 will open the gate bias path to transistor 112 when transistor 114 is in its "off" condition, e.g. during a leakage current test to determine a value of "off" state leakage current $I_{OFF}$ for the overshoot protection circuit 100. Current limiting resistor 120 will then pull the gate of transistor 112 to a "low" state since resistor 120 is tied to the common IC ground 18. Resistor 120 also functions as a current limiting resistor to control the voltage bias on the gate of transistor 112 during normal operation as described herein before.

Switching transistor 116 also is not necessary to the present invention and is provided to enhance operation of the voltage reference overshoot protection circuit 100 during tri-state operating conditions. When the open drain output of open drain output driver transistor 12 is in its tri-state condition, n-channel transistor 116 is in its "off" state. During this period of time, transistor 116 will open the voltage path to the dampening transistor 112 such that the current limiting resistor 120 will again pull the gate of transistor 112 to a "low" state, thereby turning transistor 112 "off" and reducing unwanted high impedance output current, $I_{OZ}$ from flowing during non-operational periods.

Figure 2:
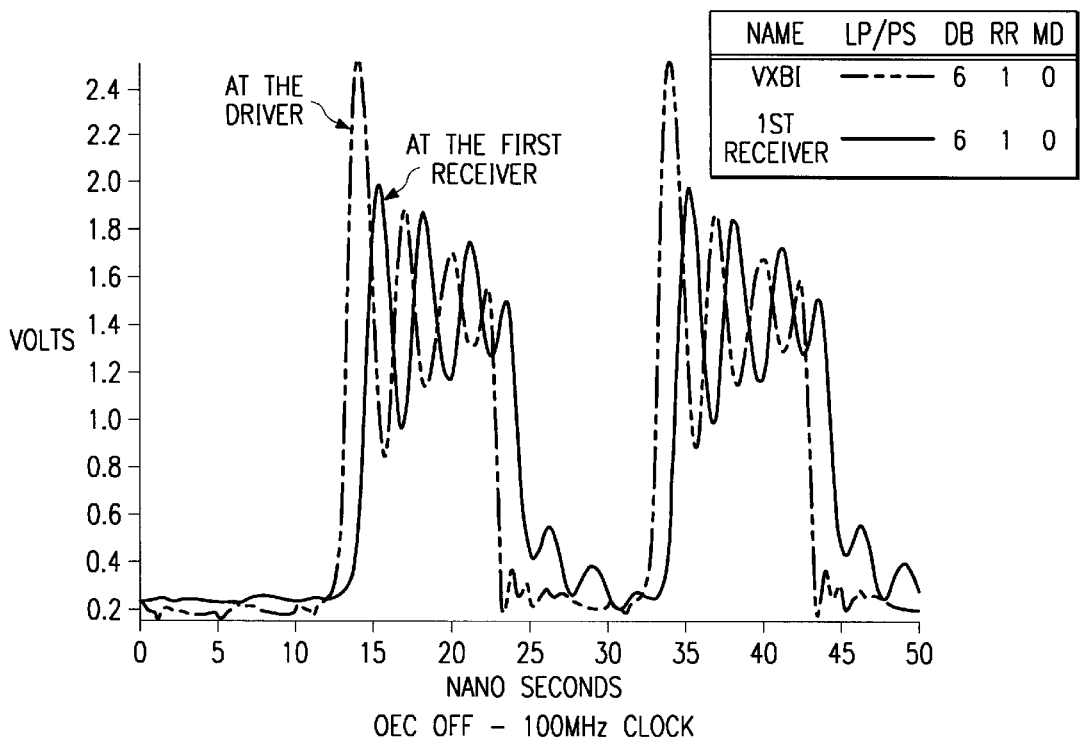
FIG. 2 illustrates unwanted ringing in a backplane caused by an open drain backplane driver circuit.

FIG. 2 illustrates unwanted ringing in a backplane caused by an open drain backplane driver circuit such as the one shown in FIG. 1A. The broken line represents the output voltage signal presented at the output of the open drain output driver transistor 12. Since the voltage swing of the output signal is so large, the received signal, e.g. backplane signal, oscillates at unwanted levels having voltage swings almost as large as 15 that presented by the output driver transistor 12.

Figure 3:
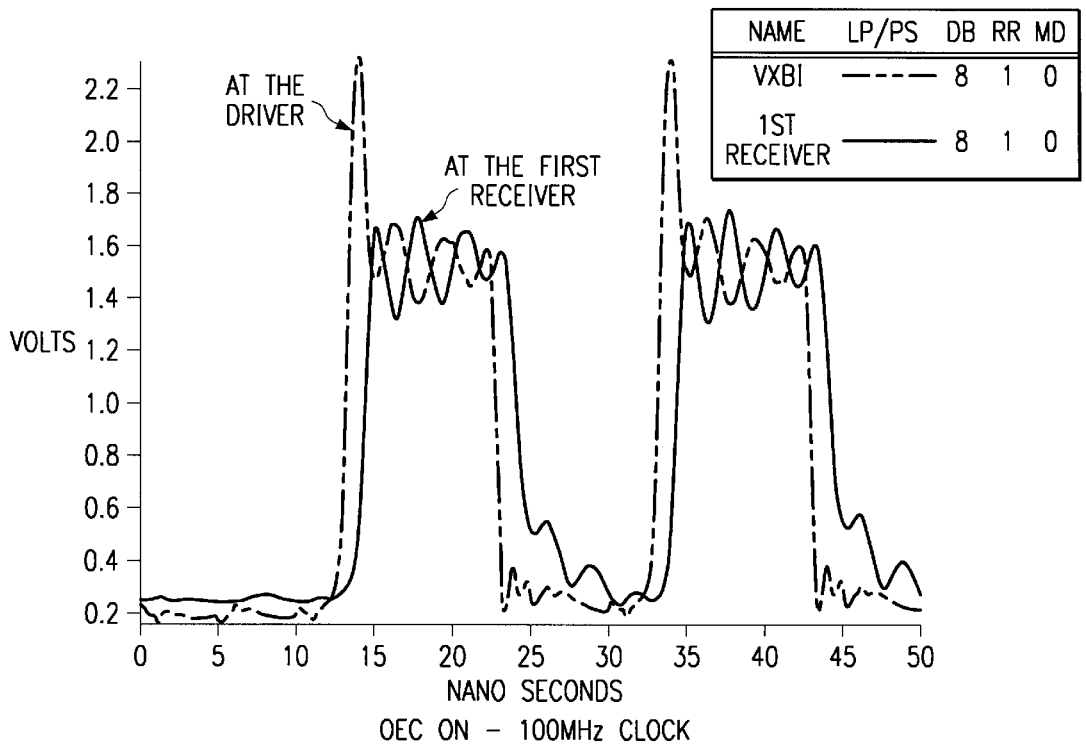
FIG. 3 is a diagram illustrating a reduction in the unwanted ringing of FIG. 2 where the reduction is attributed to the overshoot protection circuit shown in FIG. 1.

FIG. 3 is a diagram illustrating a reduction in the unwanted ringing depicted in FIG. 2 wherein the reduction is attributed to the overshoot protection circuit 100 shown in FIG. 1B. The voltage reference overshoot protection circuit 100 substantially reduces the unwanted large ringing voltage swings such that the received signal, e.g. backplane signal, remains significantly above 1.2-volts dc at all times while the output driver signal is "high."

In view of the above, it can be seen the present invention presents a significant advancement in the art of dampening circuits and associated methods. The present invention reduces propagation delay times to allow higher rates of data flow and processing by optimizing the useable bandwidth of the dampening circuit. This is accomplished since the rise and fall times of the open drain output driver are not increased to accommodate the requisite dampening functions. Further, the preferred embodiments set forth herein also accommodate $I_{OFF}$ leakage current requirements associated with backplane drivers and other like devices. Additionally, the preferred embodiments set forth herein also accommodate reduction of unwanted high impedance output current associated with backplane drivers among others. Finally, the present invention substantially improves the operational reliability of receiver devices, e.g. backplanes, since the received signal voltage levels are never allowed to drop below the requisite voltage levels necessary to provide uninterrupted, stable and reliable operation of associated transistors and other like devices.

This invention has been described in considerable detail in order to provide those skilled in the damping circuit art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while the embodiments set forth herein illustrate particular types of transistors, the present invention could just as well be implemented using other transistor types, e.g. bipolar, HBT, among others. Further, while particular embodiments of the present invention have been described herein with reference to structures and methods of voltage control, the present invention shall be understood to also parallel structures and methods of current control as defined in the claims.

What is claimed is:

1. A voltage reference overshoot dampening circuit comprising:
    a first transistor operational to receive a reference voltage signal and configured to receive an oscillating voltage signal such that the first transistor will pass a current proportional to the oscillating voltage signal there through when the oscillating voltage signal exceeds a level determined by the reference voltage signal and a turn-on voltage signal associated with the first transistor;
    an n-channel transistor having a source node configured to receive the oscillating voltage signal and a gate node configured to receive a current passed by the first transistor such that the n-channel transistor will reduce the oscillating voltage signal in proportion to a current received from the first transistor; and
    a second transistor configured as a switch to selectively stop the flow of current passed by the first transistor to the gate node of the n-channel transistor.

2. A dampening circuit according to claim 1 further comprising a fourth transistor configured as a switch to selectively decouple the gate node of the n-channel transistor such that the gate node of the n-channel transistor can be pulled into a "low" state thereby maintaining the n-channel transistor in its "off" state.

3. A voltage reference overshoot dampening circuit comprising:
    a p-channel transistor having a drain node, a gate node configured to receive a reference voltage and further having a source node configured to receive a ringing voltage such that the p-channel transistor will generate a control voltage when the ringing voltage exceeds a level determined by the reference voltage and a turn-on voltage associated with the p-channel transistor;
    an n-channel transistor having a gate node in electrical communication with the p-channel transistor drain node, a source node configured to receive the ringing voltage, the n-channel transistor configured to receive the control voltage generated by the p-channel transistor such that the n-channel transistor will reduce the ringing voltage received by the p-channel transistor; and
    a transistor configured to selectively prevent the electrical communication between the p-channel transistor drain node and the n-channel transistor gate node.

4. The voltage reference overshoot dampening circuit according to claim 3 further comprising a fourth transistor configured to selectively maintain the n-channel transistor in its "off" state.

5. A voltage reference overshoot dampening circuit comprising:
    a p-channel transistor having a drain, a gate configured to receive a reference voltage and a source configured to receive a ringing voltage such that the first transistor will generate a variable drain voltage when the ringing voltage exceeds a level determined by the reference voltage and the p-channel transistor turn-on voltage;
    first n-channel transistor having a gate configured to receive the variable drain voltage generated by the p-channel transistor and further having a source configured to receive the ringing voltage such that the first n-channel transistor will change the ringing voltage received by the p-channel transistor in response to a change in the variable drain voltage generated by the p-channel transistor; and a second n-channel transistor having a gate, a source connected to the drain of the p-channel transistor and a drain coupled to the gate of the first n-channel transistor such that a gate control signal at the second n-channel transistor gate will turn off the second n-channel transistor to selectively prevent electrical communication between the p-channel transistor drain node and the first n-channel transistor gate node.

6. The voltage reference overshoot dampening circuit according to claim 5 further comprising a current limiting resistor connected at one end to the gate of the first n-channel transistor and connected at its opposite end to a common ground associated with the voltage reference overshoot dampening circuit.

7. The voltage reference overshoot dampening circuit according to claim 5 further comprising a third n-channel transistor have a gate, a source connected to the drain of the second n-channel transistor and a drain connected to the gate of the first n-channel transistor such that a gate control signal at the third n-channel transistor gate can turn off the third n-channel transistor to selectively maintain the second transistor in its "off" state.

8. The voltage reference overshoot dampening circuit according to claim 7 wherein the reference voltage is about 1-volt dc.

9. A voltage reference overshoot dampening circuit comprising:

means for receiving a ringing voltage and generating a variable control voltage when the ringing voltage exceeds a predetermined level such that the variable control voltage amplitude at a particular moment in time is dependent on the ringing voltage amplitude at the particular moment in time;

means for receiving the variable control voltage and changing the ringing voltage amplitude at the particular moment in time in response thereto; and first switching means for substantially reducing leakage current associated with the dampening circuit when the first switching means is in a predetermined switching state.

10. The voltage reference overshoot dampening circuit according to claim 9 further comprising second switching means for substantially reducing high impedance output current associated with the dampening circuit when the second switching means is in a predetermined switching state.

11. The voltage reference overshoot dampening circuit according to claim 9 wherein the means for receiving a ringing voltage comprises a transistor.

12. The voltage reference overshoot dampening circuit according to claim 11 wherein the transistor is a p-channel device.

13. The voltage reference overshoot dampening circuit according to claim 9 wherein the means for receiving the variable control voltage comprises a transistor.

14. The voltage reference overshoot dampening circuit according to claim 13 wherein the transistor is an n-channel device.

* * * * *